United States Patent
Hu

(10) Patent No.: US 8,946,067 B2
(45) Date of Patent: Feb. 3, 2015

(54) METHOD OF MAKING A THIN CRYSTALLINE SEMICONDUCTOR MATERIAL

(76) Inventor: Bing Hu, Plano, TX (US)

( * ) Notice: Subject to any disclaimer, the term of this patent is extended or adjusted under 35 U.S.C. 154(b) by 0 days.

(21) Appl. No.: 13/494,765

(22) Filed: Jun. 12, 2012

(65) Prior Publication Data
US 2013/0330915 A1    Dec. 12, 2013

(51) Int. Cl.
*H01L 21/425* (2006.01)

(52) U.S. Cl.
USPC ............ 438/527; 438/478; 438/480; 438/514

(58) Field of Classification Search
USPC .................................. 438/478, 480, 514, 492
See application file for complete search history.

(56) References Cited

U.S. PATENT DOCUMENTS

| | | | |
|---|---|---|---|
| 6,033,974 A | 3/2000 | Henley et al. | |
| 6,194,245 B1 * | 2/2001 | Tayanaka | 438/57 |
| 7,470,600 B2 * | 12/2008 | Henley et al. | 438/458 |
| 2004/0217388 A1 * | 11/2004 | Kubena et al. | 257/222 |
| 2008/0305619 A1 * | 12/2008 | Lemmi et al. | 438/492 |
| 2011/0127588 A1 * | 6/2011 | Cheng et al. | 257/288 |

OTHER PUBLICATIONS

F. Dross et al., "Stress-induced large-area lift-off of crystalline Si films." Applied Physics A, 89, pp. 149-152, 2007.
I. Gordon et al., "Three novel ways of making thin-film crystalline-silicon layers on glass for solar cell applications." Solar Energy Materials & Solar Cells, 95, pp. S2-S7, 2011.

* cited by examiner

*Primary Examiner* — Charles Garber
*Assistant Examiner* — Brigitte Paterson
(74) *Attorney, Agent, or Firm* — Innovation Counsel LLP

(57) ABSTRACT

A method of preparing a thin material layer from a semiconductor substrate is presented. The method entails forming a stress-generating epitaxial layer on a base substrate to form a stressed region, and achieving separation along the stressed region to produce a first part and a second part. The stress-generating epitaxial layer may be boron-doped or a $Si_{(1-x)}$—$Ge_x$ material. The separation may be achieved with spalling or etching.

18 Claims, 7 Drawing Sheets

METHOD OF MAKING A THIN CRYSTALLINE SEMICONDUCTOR MATERIAL

FIELD OF INVENTION

The present invention relates generally to a process of separating materials and particularly to preparing a thin semiconductor layer.

BACKGROUND

Much research and development has taken place with solar cells in the last decade. A vast majority of solar cells in the market are silicon-based. In silicon-based solar cells, the silicon materials are in the form of either mono-crystalline or multicrystalline wafers. To get silicon wafers, polysilicon is prepared by chemical vapor deposition (CVD) in reactors from silicon-based chemicals like trichlorosilane (TCS) or saline. Subsequently, the polysilicon is placed in a furnace to achieve crystal growth. After crystal growth, ingots are sliced into wafers, often by using a mechanical slicing technique such as using a wire saw. The wafers are then fabricated into a solar cell. Given that about one-third of the price of wafer-based silicon solar modules is due to the cost of the silicon wafers, using crystalline-silicon material that is thinner than what is currently used can result in notable cost reduction.

The slicing of the wafers to produce thin material layers has its challenges. For example, during the slicing process, as much as 45% of silicon materials may be subject to kerf loss. In addition, producing wafers of desired thickness, such as a wafer that is less than 120 μm, is often difficult with a mechanical slicing technique.

One way to overcome the above disadvantages associated with mechanical slicing is by hydrogen injection into substrates via ion implantation. With this technique, a silicon wafer is subjected to ion implantation and heat treated at around 500° C. The heating causes the hydrogen underneath the surface to form bubbles, which create a weak region in the substrate that eventually facilitates the separating of a thin layer of silicon from the rest of the substrate. This type of "slicing" technique, sometimes referred to as Smart Cut, has been used for semiconductor and Kerfless substrates in solar cell applications.

Another alternative to mechanical slicing is an electro-chemical technique. With this technique, the substrate is electrochemically etched to form a porous layer. Typically, two porous layers form on a substrate. The porous layer that is closer to the exposed surface has a lower porosity than the porous layer that lies deeper in the substrate. At high temperature, the silicon atoms in the top layer rearrange themselves and form a monocrystalline layer. Because the lower layer is highly porous, the thin layer of silicon on top can be separated from the substrate. This method may be used in combination with epitaxy. Namely, after porous layers are formed on the substrate, the substrate is subjected to an epitaxial process whereby an epitaxial layer is grown on the top porous layer. The silicon atom rearrangement that took place before the epitaxial process allows the growth of the epitaxial layer on the top porous layer. After the epitaxial process, the epitaxial layer and the top substrate layer may be separated from the substrate.

Yet another alternative to mechanical slicing is stress-spalling, which entails applying a metal paste on top of a silicon substrate and subjecting the substrate to thermal treatment. Due to the difference in thermal expansion coefficients between the metal and the silicon substrate, compressive stress is introduced into the substrate. Facilitated by this stress, a thin layer of silicon can be separated from the substrate by spalling after cool down.

The above-described alternatives to mechanical slicing, as well as some other known methods, have their disadvantages. Some disadvantages may be, for example, use of HF, high cost, and possible metal contamination. Furthermore, unlike spalling off a single layer from an epitaxial layer, the above methods have varying degrees of substrate consumption. Hence, new techniques for separating a thin material layer from a larger wafer or substrate is desired.

SUMMARY

In one aspect, the invention includes a method of preparing a semiconductor structure. The method entails forming a stress-generating epitaxial layer on a base substrate to form a stressed region, and achieving separation along the stressed region to produce a first part and a second part. Usually, the stressed region experiences a compressive stress. The stress-generating epitaxial layer may be a boron-doped layer or a $Si_{(1-x)}$—$Ge_x$ layer.

Optionally, etching may be used for separation by using the stress-generating epitaxial layer as an etch stopper.

DETAILED DESCRIPTION

Figure 1A:
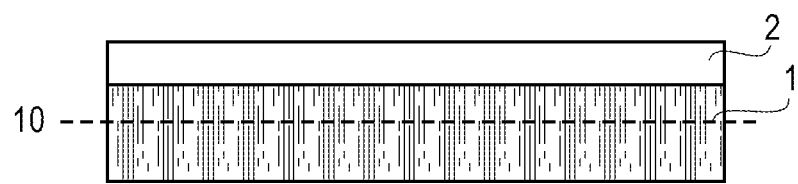
FIG. 1A depicts a structure having a base substrate and a stress-generating epitaxial layer in accordance with the invention.

Although the disclosure is presented in the context of solar cell application, this is not a limitation of the invention and the concepts disclosed herein may be used for other applications, including but not limited to silicon-on-insulator (SOI) or other semiconductor applications. As used herein, a layer being "directly on" another layer is intended to mean that the two layers are in contact. In contrast, a layer being "on" another layer includes cases where there are other layers between the two layers.

In one aspect, the invention provides a method of producing the desired thin layer from a substrate or from an epitaxial layer without consuming the substrate. After separation, the base substrate or the structure including the base substrate and the epitaxial layer is reusable. The invention also includes a way to achieve the separation in a controlled manner so that the separated layer is of the desired thickness.

In one embodiment, the method entails introducing a compressive stress to the base substrate or an epitaxial layer to create a compressive-stressed region, and achieving separation along the compressive-stressed region to produce a thin layer. The stress-generating epitaxial layer may be either a heavily B-doped epitaxial layer, a $Si_{(1-x)}$—$Ge_x$ epitaxial layer, or a combination thereof. The thin layer of material that is obtained as a result of the separation can be silicon, germanium, or their combination based on substrate materials and epitaxial layer materials. It can be part of a substrate, a combination of part of a substrate and part of an epitaxial layer, or an epitaxial layer. The thin layer of material may be a single layer or a combination of layers. Mechanical force, such as spalling, may be used to achieve the separation.

In another embodiment, an etchant is used to etch off a sacrificial epitaxial layer between two etch stoppers, one of which may be the substrate if the substrate can serve as an etch stopper. Above the top etch stopper is the desired epitaxial layer (herein referred to as the "target epitaxial layer"), which may be silicon, germanium, or their combination. The top and bottom parts become separated upon the etching of the sacrificial layer.

Methods of the invention provide alternative ways to get thin crystalline silicon layer or germanium layer cost-effectively, with less energy consumption, less material waste, and fewer process steps.

In this disclosure, the base substrate may be Si or Ge. The stressed region generally refers to a planar region extending parallel to the surface of a base substrate 1 that contacts neighboring layers. A "target epitaxial layer" may be doped or undoped. Where it is doped, the dopant may be B, Ga, P, Sb, or As. The target epitaxial layer may be a single layer or a combination of different layers. An epitaxial layer that is "heavily boron-doped" or "heavily doped," as used herein, indicates that the resistivity is ≤0.01 ohm-cm. A "thin layer," as used herein, typically refers to a material having a thickness that is less than or equal to about 120 μm.

FIG. 1A depicts a structure having a base substrate 1 and a stress-generating epitaxial layer 2 formed thereon. Forming an epitaxial layer introduces stress into the base substrate 1 if the lattice constant of the epitaxial layer is different from the lattice constant of the base substrate (i.e., there is a lattice mismatch between the two layers). The lattice mismatch may be accompanied by a difference in the resistivities of the epitaxial layer and the substrate. The lattice mismatch applies stress to the base substrate and the epitaxial layer. The larger the lattice mismatch between the epitaxial layer and the substrate, the larger is the stress that results. And larger the stress, the farther away a stressed region 10 is from the stress-generating epitaxial layer 2. Hence, the position of the stressed region 10 may be controlled by the amount of stress that is applied. Where the stress-generating epitaxial layer 2 is a $Si_{(1-x)}$—$Ge_x$ layer, the resistivity may be about the same for the two layers.

The stress-generating epitaxial layer 2 may be formed by using an epitaxial method, including but not limited to chemical vapor deposition (CVD), reduced pressure chemical vapor deposition (RPCVD), plasma enhanced chemical vapor deposition (PECVD), and molecular beam epitaxy (MBE). The layers of the structures in this disclosure are epitaxially grown/deposited in substantially the same manner.

Generally, where there are two layers with different lattice constants, the layer with the smaller lattice structure experiences a tensile stress and the layer with the larger lattice structure experiences compressive stress. Doping may be used to control the lattice dimension. For example, the stress-generating epitaxial layer 2 may be doped during formation. When the substrate and the epitaxial layer 2 are both silicon, the stress-generating epitaxial layer 2 is heavily boron-doped. Due to the fact that boron atoms are smaller than Si atoms, the lattice in the heavily boron-doped epitaxial layer is smaller and distorted compared to that of silicon substrate that is not heavily boron doped. The epitaxial layer 2 is thus subjected to a tensile stress and an adjacent layer (e.g., the base substrate 1) is subjected to a compressive stress. Hence, FIG. 1A shows a stressed region 10 in the substrate 1 where separation would occur. When the substrate is germanium, the stress-generating epitaxial layer 2 may be a heavily boron-doped Ge layer, a silicon epitaxial layer, or a $Si_{(1-x)}Ge_x$ layer for the stressed region 10 to be in the substrate, as shown in FIG. 1A.

To introduce compressive stress to an adjacent layer, the lattice of heavily B-doped stress-generating epitaxial layer 2 is smaller than that of the adjacent layer and thus, the resistivity of heavily boron-doped stress-generating epitaxial layer 2 is usually lower than that of the substrate or other epitaxial layers. For example, where the substrate is a Si substrate, the resistivity of the heavily-B-doped stress-generating epitaxial layer 2 may be less than 0.001 ohm-cm to achieve large enough stress for separation. The resistivity of stress-generating boron-doped layer will be between 0.0001 ohm-cm to 0.01 ohm-cm depending on separation requirement and epitaxial matrix materials like Si or Ge. Often, the base substrate 1 or the target epitaxial layer (described below) is also doped with one of the dopants like B, Ga, P, As, or Sb. The lower the resistivity of heavily B-doped stress-generating epitaxial layer 2, the larger will be the compressive stress exerted on the neighboring layer.

Figure 3:
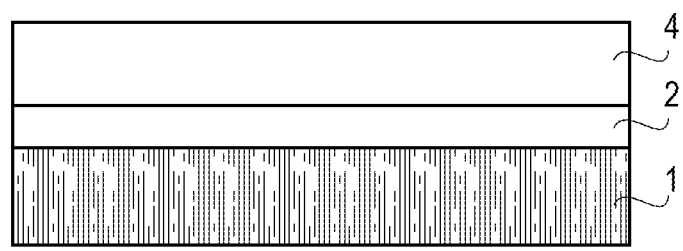
FIG. 3 depicts the structure of FIG. 1A with a $Si_{(1-x)}$—$Ge_x$ layer on top to compensate for the surface curvature.

Sometimes, Ge atoms, which are larger than Si atoms, may be introduced in the form of a $Si_{(1-x)}$—$Ge_x$ layer 4 to the embodiment of FIG. 1A. This $Si_{(1-x)}$—$Ge_x$ layer 4 may be disposed on top of the stress-generating epitaxial layer 2 to compensate for the surface curvature on the silicon substrate that is caused by the heavily boron-doped stress layer, as shown in FIG. 3.

Figure 4:
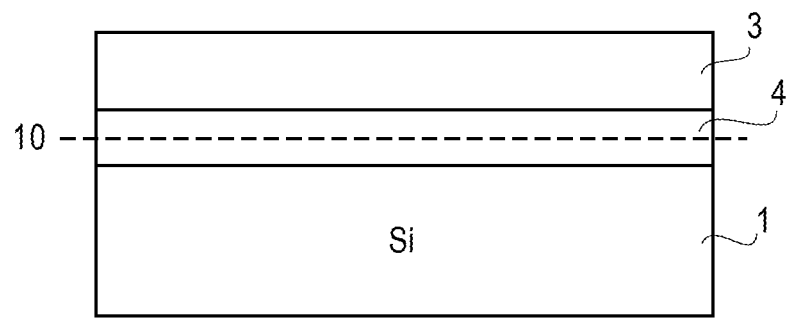
FIG. 4 depicts a structure that uses Si substrate and a $Si_{(1-x)}$—$Ge_x$ layer as a stress-generating layer.
Figure 5:
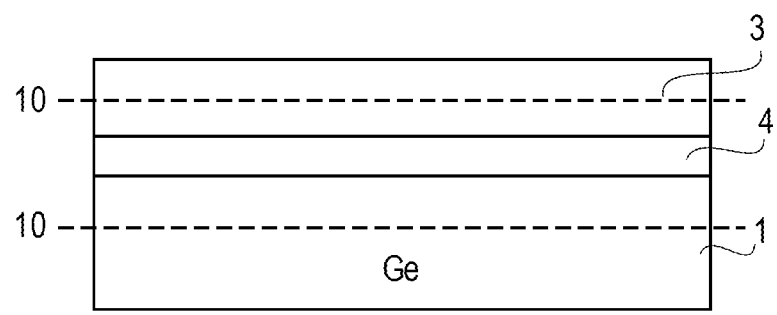
FIG. 5 depicts a structure that uses Ge substrate and a $Si_{(1-x)}$—$Ge_x$ layer.

In some embodiments, such as the one shown in FIG. 4, the $Si_{(1-x)}$—$Ge_x$ layer 4 may be used as the stress-generating epitaxial layer 2 instead of the boron-doped epitaxial layer. In this case, the $Si_{(1-x)}$—$Ge_x$ layer 4 is usually used in the middle of a sandwich structure for silicon materials such as between the substrate 1 and other epitaxial layer 3. When used on silicon materials, the $Si_{(1-x)}$—$Ge_x$ layer 4 experiences compressive stress from both sides and separation happens at the $Si_{(1-x)}$—$Ge_x$ layer 4. When used with a Ge substrate, as shown in FIG. 5, the $Si_{(1-x)}$—$Ge_x$ layer 4 exerts compressive stress on the neighboring layers, such as the Ge substrate and/or the Ge target epitaxial layer 3.

Figure 7:
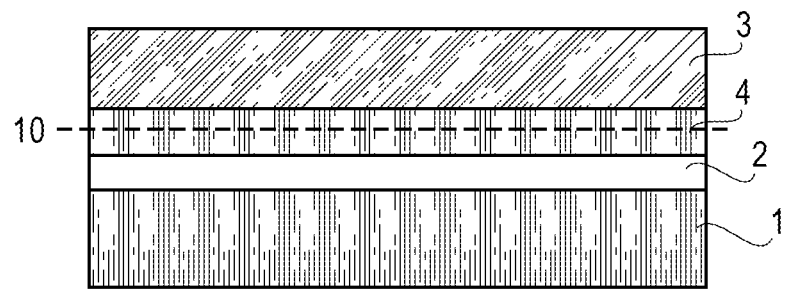
FIGS. 7 and 8 depict a structure having a base substrate, a boron-doped epitaxial layer, a $Si_{(1-x)}$—$Ge_x$ layer, and the target material layer in accordance with the invention.

The invention is not limited to any particular type of resistivity and dopant for the $Si_{1-x}$—$Ge_x$ layer. Likewise, any suitable number may be used as the x of the $Si_{(1-x)}$—$Ge_x$ layer 4 as long as the $Si_{(1-x)}$—$Ge_x$ layer 4 experiences large enough stress to be conducive to separation. When the substrate is silicon and where the stress-generating epitaxial layer 2 is a combination of layers, the exact arrangement of the layers may be varied. For example, the $Si_{(1-x)}$—$Ge_x$ layer 4 may be deposited directly on the base substrate 1, such that the $Si_{(1-x)}$—$Ge_x$ layer is between the heavily boron-doped epitaxial layer and the base substrate 1. In another implementation, the heavily B-doped epitaxial layer is formed on the substrate before the $Si_{(1-x)}$—$Ge_x$ layer 4 (as depicted in FIG. 7 below). Placing the heavily B-doped epitaxial layer and the $Si_{(1-x)}$—$Ge_x$ layer adjacent to each other generally increases the stress for separation, facilitating the separation process.

Figure 1B:
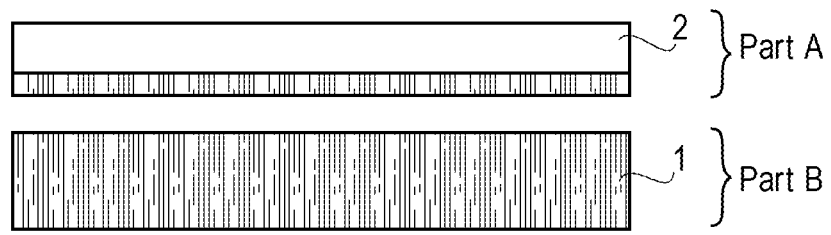
FIG. 1B illustrates separation of the structure of FIG. 1A into two parts.

FIG. 1B illustrates separation of the structure of FIG. 1A into first and second parts. Separation is achieved along the stressed region 10 (shown in FIG. 1A) by any well-known and suitable methods, such as spalling or fluid pressure, to produce Part A and Part B. Part A with the stress-generating layer 2 and part of the substrate 1 may be used to build a chip or a solar cell. Part B, which includes the substrate 1, may be reused as a substrate. The thicknesses of the two parts is controlled by varying the dopant concentration in the boron-doped stress-generating epitaxial layer 2, which in turn determines the position of the stressed region 10.

Figure 2A:
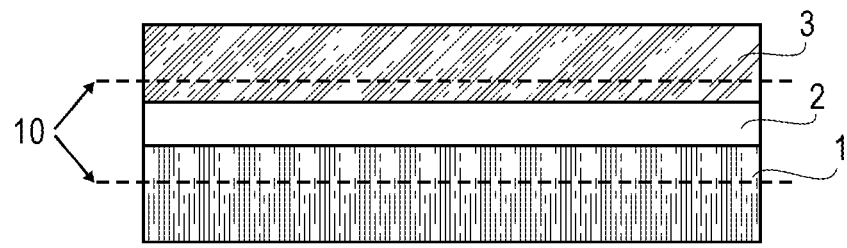
FIG. 2A depicts structures having a base substrate, a stress-generating epitaxial layer, and a target material layer in accordance with the invention.

FIG. 2A depicts the base substrate 1, the stress-generating epitaxial layer 2, and a target epitaxial layer 3. The target epitaxial layer 3 is the thin material layer that is desired, and may include a plurality of epitaxially-grown layers. The stress-generating epitaxial layer 2 may include a plurality of layers, with or without other epitaxial layers therebetween. In this embodiment, the stress-generating epitaxial layer 2 applies compressive stress to the neighboring layers, namely the base substrate 1 and the target epitaxial layer 3. Hence, separation may be achieved at one or both of these layers, as indicated by the stressed regions 10 shown in FIG. 2A. The target epitaxial layer 3 may be formed slightly thicker than the desired thickness, to account for the fact that some of it gets separated off as shown in FIG. 2B.

Figure 2D:
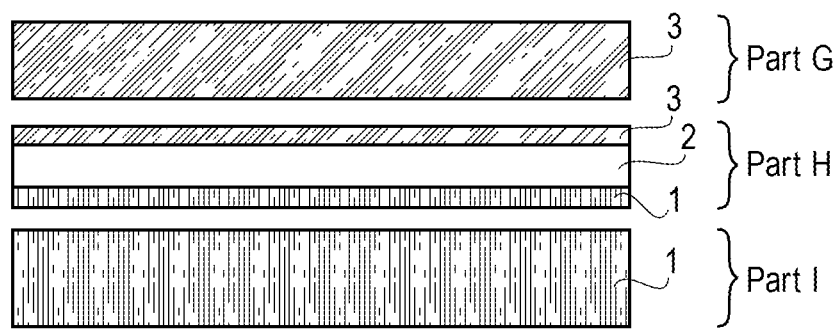
FIG. 2D illustrates separation of the structure of FIG. 2A into three parts.
Figure 2B:
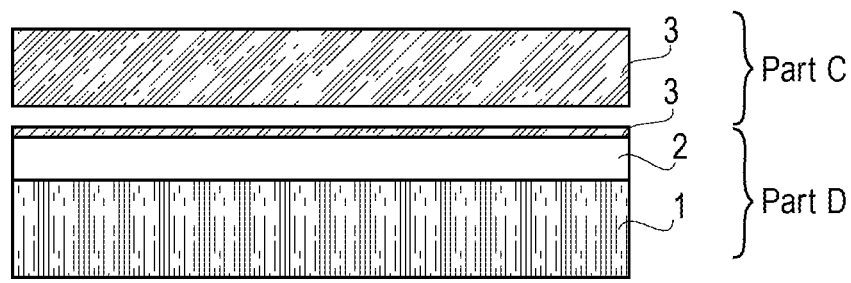
FIGS. 2B and 2C illustrates separation of the structure of FIG. 2A into two parts.
Figure 2C:
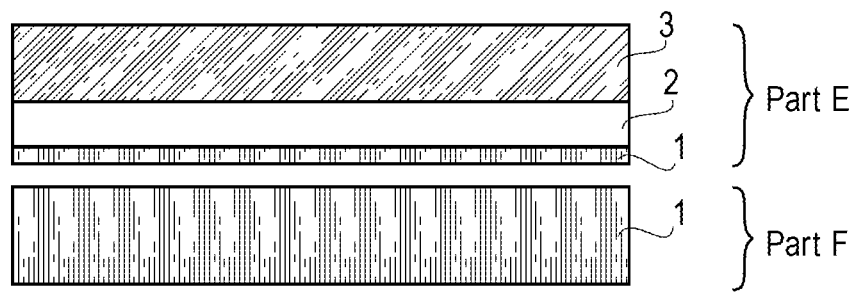

FIGS. 2B, 2C, and 2D illustrate different ways in which the structure of FIG. 2A can be separated. Separation is achieved along the stressed region 10 shown in FIG. 2A, by any well-known and suitable methods, such as application of mechanical force or fluid pressure. FIG. 2B illustrates the case where separation occurs in the target epitaxial layer 3. The structure is separated into Part C, which includes the target epitaxial layer 3, and Part D, which includes the substrate 1, the stress-generating epitaxial layer 2, and part of the target epitaxial layer 3. FIG. 2C illustrates the case where separation occurs in the substrate 1. In this case, the structure is separated into Part E, which includes the target epitaxial layer 3, the stress-generating epitaxial layer 2, and some of the substrate 1.

FIG. 2D illustrates the case where separation is achieved at both the substrate 1 and the target epitaxial layer 3, dividing the structure of FIG. 2A into three parts: Part G, Part H, and Part I. Part G includes just the target epitaxial layer 3, and Part I includes just the substrate 1. Part H includes the stress-generating epitaxial layer 2 as well as some of the substrate 1 and some of the target epitaxial layer 3. Unlike the processes described above, the process of FIG. 2D results in multiple thin material layers being formed at the same time.

Figure 6:
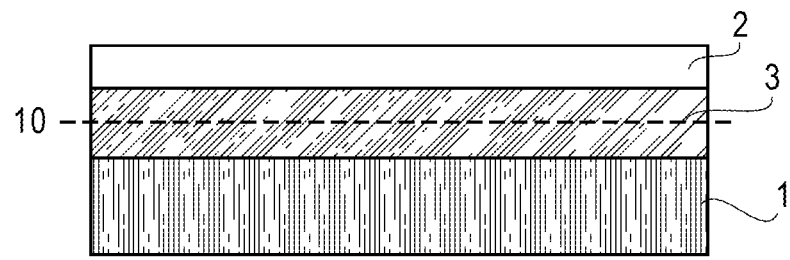
FIG. 6 depicts a structure where the base substrate and the stress-generating epitaxial layer sandwiches a target epitaxial layer.

FIG. 6 depicts the base substrate 1 and the stress-generating epitaxial layer 2 sandwiching the target epitaxial layer 3. As previously mentioned, the stress-generating epitaxial layer 2 may consist of multiple stress-generating layers (e.g., boron-doped layer, $Si_{1-x}$—$Ge_x$ layer) with or without other epitaxial layer(s) therebetween. The stress-generating epitaxial layer 2 applies compressive stress to a neighboring layer, which in this case is the target epitaxial layer 3. Hence, the compressive-stressed region 10 is located in the target epitaxial layer 3 as shown. The stress-generating layer 2 in this embodiment may include a $Si_{(1-x)}$—$Ge_x$ layer on top of the Boron-doped layer where the substrate and epitaxial layers are silicon.

FIG. 7 depicts an embodiment including the base substrate 1, the stress-generating epitaxial layer 2, and the target epitaxial layer 3. Unlike the embodiment of FIG. 2A, however, this embodiment includes the $Si_{(1-x)}$—$Ge_x$ layer 4 between the stress-generating epitaxial layer 2 and the target epitaxial layer 3. The target epitaxial layer 3, in this case, is a Si layer and the stress-generating layer 2 is a heavily boron-doped epitaxial layer. Because Ge has a larger size than Si, this results in the $Si_{(1-x)}$—$Ge_x$ layer applying a tensile stress to its neighboring layers and experiencing compressive stress from neighboring layers. Hence, the most-stressed stressed region 10 is in the $Si_{(1-x)}$—$Ge_x$ layer 4 as shown in FIG. 7.

Figure 8:
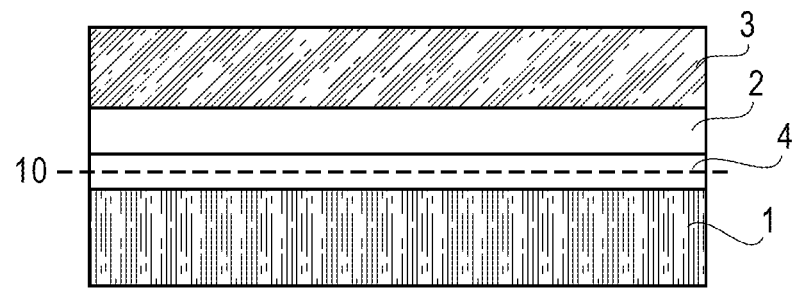

FIG. 8 depicts an embodiment that is similar to that of FIG. 7, except that the positions of the stress-generating layer 2 and the $Si_{(1-x)}$—$Ge_x$ layer 4 are reversed. The $Si_{(1-x)}$—$Ge_x$ layer 4 applies stress to its neighboring layers and experiences compressive stress. Hence, the most-stressed stressed region 10 is in the $Si_{(1-x)}$—$Ge_x$ layer 4.

Figure 9:
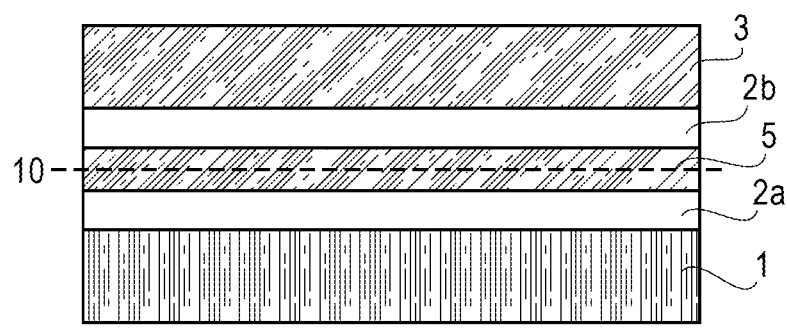
FIG. 9 depicts a structure having two stress-generating epitaxial layers.

FIG. 9 depicts an embodiment where the stress-generating epitaxial layer 2 is positioned between the base substrate 1 (which may be Si or Ge) and the target epitaxial layer 3. The stress-generating epitaxial layer 2 is formed as a first stress-generating layer 2a and a second stress-generating layer 2b, which are positioned above and below a sacrificial layer 5, which is an epitaxial layer. The epitaxial layers 2a and 2b are heavily boron-doped layers. The sacrificial layer 5 may be an epitaxial layer that is either not doped or doped lightly compared to the heavily boron-doped layers 2a, 2b. Alternatively, the sacrificial layer 5 may be a $Si_{(1-x)}$—$Ge_x$ layer where the substrate and the epitaxial layer are silicon. The sacrificial layer 5 receives high compressive stress from the neighboring epitaxial layers 2a and 2b. Hence, the separation happens in the sacrificial layer 5. Separation along the most-stressed stressed region 10 may be achieved by spalling, as in the above embodiments. In some embodiments, there may be one or more epitaxial layers between the epitaxial layer 2a and the base substrate 1 and/or between the epitaxial layer 2b and the target epitaxial layer 3.

Where the substrate 1 is a Si substrate in the embodiment of FIG. 9, the separation may be achieved by etching. Specifically, the sacrificial layer 5 may be etched because the heavily boron-doped epitaxial layers 2a, 2b act as etch stoppers, preventing any etching of the base substrate 1 and the target epitaxial layer 3 by the etchant. In this particular embodiment, the epitaxial layers 2a, 2b may be heavily boron-doped, usually to a resistivity that is ≤0.001 ohm-cm. In one embodiment, the first etch stopper 2a may be the substrate 1 itself if the substrate 1 is boron-doped and the resistivity is low enough to function as an etch stopper, or formed by boron diffusion or boron ion implantation into the base substrate 1. If the etch stopper is formed epitaxially, one or more other epitaxial layers may be formed between the base substrate 1 and the first etch stopper. A sacrificial epitaxial layer 5, which may be doped or not doped, is deposited on the first etch stopper 2a and followed by the second etch stopper 2b. If the sacrificial layer 5 is boron-doped, the doping should be done lightly so that its resistivity does not become too low and reduce silicon etching rate. The second etch stopper, which may have the same composition as the first etch stopper, is also a heavily boron-doped epitaxial layer.

Where etching is used as the separation method, there is no need for the stressed region 10. The boron doping causes lattice mismatches in the epitaxial layer, which in turn may cause defects, wafer bowing, etc. that are not desirable. To overcome these defects, Ge may be introduced into the etch stopper to compensate for the lattice shrinkage caused by the heavy boron-doping of silicon. A Ge-compensated etch stopper exerts little or no stress to the neighboring layers. If the etch stopper is prepared epitaxially, it can be heavily Si:B or $(Si_{(1-x)}-Ge_x)$:B. Where the substrate and epitaxial layers are Ge, the etch stopper may be Ge:B. The sacrificial epitaxial layer between two etch stoppers can be etched to separate the base substrate 1 from the target epitaxial layer 3.

The etch stopper 2b may be removed or retained.

Figure 10:
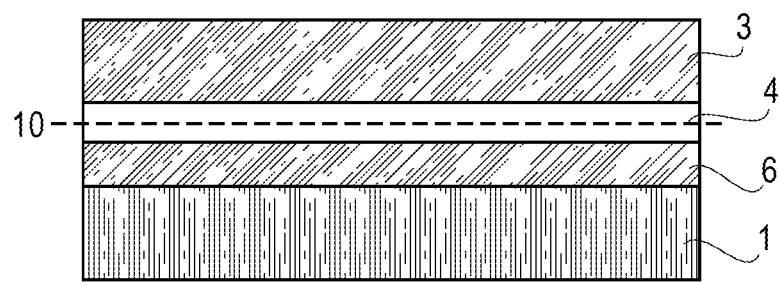
FIG. 10 depicts a structure that includes a $Si_{(1-x)}$—$Ge_x$ layer and an epitaxial layer that is not heavily boron-doped.

FIG. 10 depicts a case where the structure includes the $Si_{(1-x)}-Ge_x$ layer 4 and an epitaxial layer 6 that is not a heavily boron-doped layer. As shown, this embodiment includes the epitaxial layer 6 positioned between the base substrate 1 (which in this case is Si) and the target epitaxial layer 3. The $Si_{(1-x)}-Ge_x$ layer 4 is positioned between the epitaxial layer 6 and the target epitaxial layer 3. In the particular embodiment that is shown, the epitaxial layer 6 is directly on the base substrate 1, and the $Si_{(1-x)}-Ge_x$ layer 4 is on it. As the $Si_{(1-x)}-Ge_x$ layer 4 generates compressive stress within itself, the stressed region 10 is in the $Si_{(1-x)}-Ge_x$ layer 4, as shown. The stress-generating epitaxial layer (which in this case is the $Si_{(1-x)}-Ge_x$ layer 4) may or may not be doped.

Figure 11:
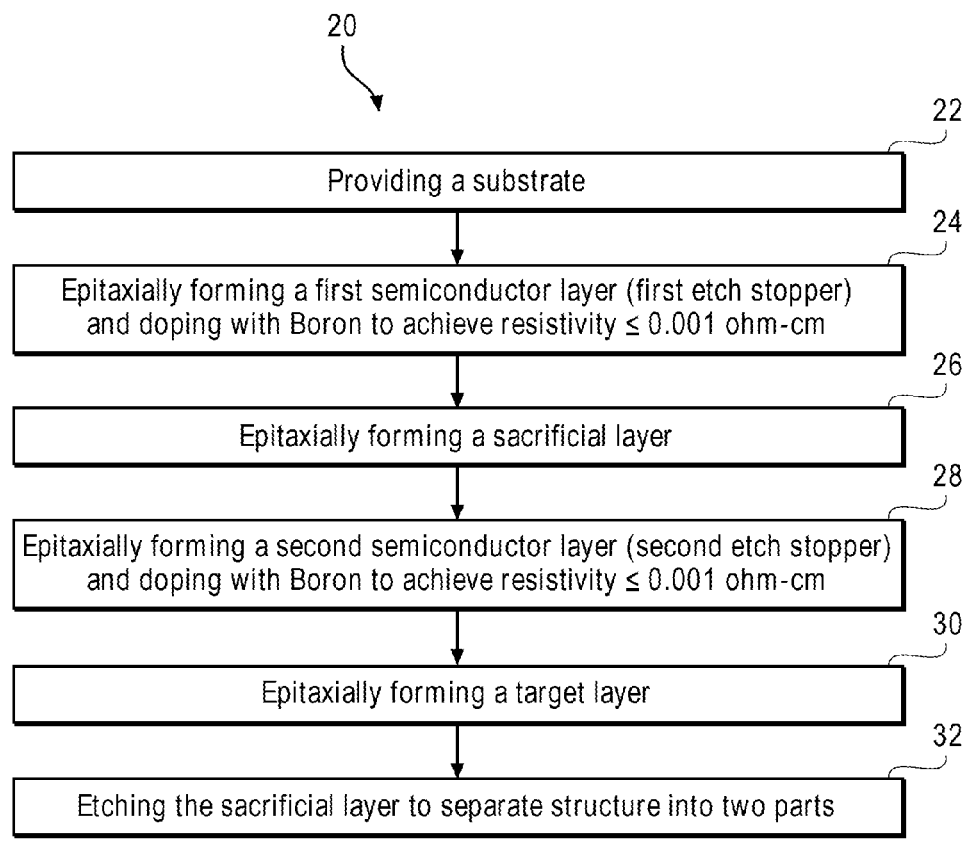
FIG. 11 is a flowchart summarizing the etching-based separation process that may be used with the structure of FIG. 9.

FIG. 11 is a flowchart summarizing an etching process 20 that may be used to generate and separate the structure of FIG. 9. As shown, a semiconductor substrate is provided (step 22). A first etch stopper 2a is formed as a heavily boron-doped epitaxial layer (step 24). A sacrificial layer 5 (doped or not) is formed, e.g. epitaxially formed (step 26), followed by a second etch stopper 2b (step 28). The second etch stopper 2b is formed in substantially the same manner as the first etch stopper 2a. Then, a target layer 3 is epitaxially formed on the second etch stopper 2b (step 30) and separation is achieved by etching (step 32). Any suitable and well-known etchant may be used for the etching process.

Using the techniques mentioned above, a thin layer of the substrate material, the epitaxial layer, or both may be obtained for various applications including but not limited to a solar cell or SOI. The desired epitaxial layer includes a single epitaxial layer or multiple epitaxial layers.

To achieve the best separation effect, the resistivity of heavily boron doped stress-generating layer may be introduced as a step change or a gradual change to the adjacent layers in the embodiments above. Likewise, the x in $Si_{(1-x)}-Ge_x$ stress generating layer may be a constant or a number that changes with the position within the layer to form a gradient.

This invention includes any structures that is similar to the figures described above by adding other single layer or plural layer above substrate, between substrate and the epitaxial layer, between epitaxial layers or above or below the stress generating layer.

It should be understood that the invention can be practiced with modification and alteration within the spirit and scope of the appended claims. The description is not intended to be exhaustive or to limit the invention to the precise form disclosed. It should be understood that the invention can be practiced with modification and alteration.

What is claimed is:

1. A method of preparing a semiconductor structure, comprising:
    forming a stress-generating epitaxial layer on a silicon or germanium base substrate to form a stressed region, wherein the stress-generating epitaxial layer is a boron-doped epitaxial layer;
    forming a second epitaxial layer on the stress-generating epitaxial layer;
    forming a third epitaxial layer on the second epitaxial layer, wherein the third epitaxial layer is boron-doped such that boron dopant concentration in the stress-generating epitaxial layer and the third epitaxial layer yields a resistivity that is ≤0.001 ohm-cm;
    forming a target epitaxial layer on the third epitaxial layer; and
    achieving separation along the stressed region to produce a first part and a second part.

2. The method of claim 1, wherein the stressed region experiences compressive stress.

3. The method of claim 1, further comprising controlling thicknesses of the two parts by varying dopant concentration in the boron-doped epitaxial layer.

4. The method of claim 3, wherein the boron-doped epitaxial layer has a boron concentration that yields a resistivity between 0.0001 ohm-cm and 0.001 ohm-cm.

5. The method of claim 1 further comprising doping the target epitaxial layer with one of B, Ga, P, Sb, and As.

6. The method of claim 1, wherein the target epitaxial layer comprises a plurality of layers.

7. The method of claim 1, wherein the stressed region is in a layer that neighbors the stress-generating epitaxial layer.

8. The method of claim 1, further comprising a $Si_{(1-x)}-Ge_x$ layer.

9. The method of claim 8, wherein the $Si_{(1-x)}-Ge_x$ layer is between the base substrate and the target epitaxial layer.

10. The method of claim 8, wherein the stressed region is in the $Si_{(1-x)}-Ge_x$ layer.

11. The method of claim 1, wherein the second epitaxial layer is silicon or $Si_{(1-x)}-Ge_x$, and the boron dopant concentration is between zero and a number that is lower than the concentration of the stress-generating epitaxial layer and the third epitaxial layer, and wherein the stressed region is in the second epitaxial layer.

12. The method of claim 1 further comprising etching the second epitaxial layer by using the stress-generating epitaxial layer and the third epitaxial layer as etch stoppers.

13. The method of claim 12 further comprising adding Ge to the stress-generating and third epitaxial layer to weaken a stress exerted on a neighboring layer.

14. The method of claim 1, wherein the base substrate is germanium and the stress-inducing epitaxial layer and the third epitaxial layer are either boron-doped germanium or a $Si_{(1-x)}-Ge_x$ layer.

15. The method of claim 1, wherein the stress-generating epitaxial layer is a $Si_{(1-x)}-Ge_x$ layer and the first part includes the base substrate that is a Ge layer.

16. The method of claim 1, wherein the base substrate is doped with at least one of B, Ga, P, As, or Sb.

17. The method of claim 1, wherein the separation is achieved with spalling or etching.

18. The method of claim 1, wherein at least one of the first part and the second part has a thickness of less than or equal to 120 μm.

\* \* \* \* \*